United States Patent
Iyama et al.

(10) Patent No.: US 8,822,134 B2
(45) Date of Patent: Sep. 2, 2014

(54) RESIST DEVELOPER, METHOD FOR FORMING A RESIST PATTERN AND METHOD FOR MANUFACTURING A MOLD

(75) Inventors: Hiromasa Iyama, Shinjuku-ku (JP); Hideo Kobayashi, Shinjuku-ku (JP)

(73) Assignee: Hoya Corporation, Tokyo (JP)

( * ) Notice: Subject to any disclaimer, the term of this patent is extended or adjusted under 35 U.S.C. 154(b) by 0 days.

(21) Appl. No.: 13/638,249

(22) PCT Filed: Mar. 28, 2011

(86) PCT No.: PCT/JP2011/057530
§ 371 (c)(1),
(2), (4) Date: Dec. 13, 2012

(87) PCT Pub. No.: WO2011/125571
PCT Pub. Date: Oct. 13, 2011

(65) Prior Publication Data
US 2013/0078578 A1 Mar. 28, 2013

(30) Foreign Application Priority Data
Mar. 31, 2010 (JP) ................. 2010-081394

(51) Int. Cl.
*G03F 7/32* (2006.01)
(52) U.S. Cl.
CPC ............. *G06F 7/325* (2013.01); *Y10S 430/143* (2013.01)
USPC ...................... 430/296; 430/331; 430/942
(58) Field of Classification Search
CPC ... G03F 7/2037; G03F 7/2051; G03F 7/2059; G03F 7/2065; G03F 7/32
USPC ......................... 430/296, 331, 942
See application file for complete search history.

(56) References Cited

FOREIGN PATENT DOCUMENTS

| JP | 2-221962 A | 9/1990 |
|---|---|---|
| JP | 10-228117 A | 8/1998 |
| JP | 2000-039717 A | 2/2000 |
| JP | 2002-525683 A | 8/2002 |
| JP | 2006-227174 A | 8/2006 |
| JP | 2009-226762 A | 10/2009 |
| WO | 00/17712 A1 | 3/2000 |

OTHER PUBLICATIONS

Xiaomin Yang, et al., "Challenges in 1 Teradot/in.$^2$ dot patterning using electron beam lithography for bit-patterned media", J. Vac. Sci. Technol. B, Nov./Dec. 2007, pp. 2202-2209, vol. 25, No. 6.

*Primary Examiner* — Christopher Young
(74) *Attorney, Agent, or Firm* — Sughrue Mion, PLLC

(57) ABSTRACT

The disclosed resist developer is used when developing by irradiating an energy beam onto a resist layer containing a polymer of α-chloromethacrylate and α-methylstyrene for rendering or exposure, and contains a fluorocarbon-containing solvent (A) and an alcohol solvent (B), the latter of which has higher solubility relative to the resist layer than the former.

10 Claims, 4 Drawing Sheets

RESIST DEVELOPER, METHOD FOR FORMING A RESIST PATTERN AND METHOD FOR MANUFACTURING A MOLD

CROSS REFERENCE TO RELATED APPLICATIONS

This application is a National Stage of International Application No. PCT/JP2011/057530 filed Mar. 28, 2011, claiming priority based on Japanese Patent Application No. 2010-081394, filed Mar. 31, 2010, the contents of all of which are incorporated herein by reference in their entirety.

TECHNICAL FIELD

The present invention relates to a resist developer, a method for forming a resist pattern and a method for manufacturing a mold, in particular, relates to a developer and a developing method in forming a pattern on a resist.

BACKGROUND ART

Conventionally, regarding a magnetic medium used for a hard disc and the like, there has been used a method in which magnetic particles are made into infinitesimals, a width of the magnetic head is minimized, and a width between the data tracks on which information is recorded is narrowed, so as to achieve a high recording density. On the other hand, a higher recording density has been increasingly demanded, and magnetical influence between adjacent tracks can be no longer ignorable with regards to the magnetic medium. Accordingly, the conventional method reaches its limits in terms of the higher recording density.

In recent years, there has been proposed a new type of medium referred to as a patterned medium in which the data track of the magnetic medium is formed to be magnetically separated. The patterned medium is such that an unnecessary portion of a magnetic material in terms of recording is removed (grooved) so as to improve the quality of signals and achieve a higher recording density.

As a technique for mass-producing the patterned medium, there has been known an imprint technology (or referred to as nanoimprint technology), in which a copy mold (also referred to as working replica) is reproduced by transferring a master mold or an archetype mold based on the master mold one time or plural times, and a pattern of the copy mold is transferred to a transfer target body (herein, a magnetic medium) to manufacture the patterned medium. Hereinafter, the master mold and the copy mold are collectively, simply referred to as a mold.

As a method of forming a resist pattern to produce the imprint mold, for example, patent document 1 discloses a technology that a copolymer of α-methylstyrene and α-chloro-acrylic acid is applied to a quartz substrate as a resist so as to form a resist layer, and an electron beam drawing or exposure (hereinafter referred to as electron beam drawing) is carried out for the resist layer, and the developer for the resist is made up of n-amyl acetate.

Also, as the related technology and a technology used for semiconductor manufacturing, there has been known a technology that a mixed liquid of methyl isobutyl ketone and isopropanol is used as a developer for the resist made up of the copolymer of α-methylstyrene and α-chloro-acrylic acid (for example, see patent document 2).

Also, as the related technology and a technology used for manufacturing the patterned medium, there has been known a technology that isopropanol is used as the developer for the resist made up of the copolymer of α-methylstyrene and α-chloro-acrylic acid (for example, see non-patent document 1).

Similarly, as the related technology and a technology used for optical image formation, in particular, for semiconductor manufacturing, there has been known a technology that Vertrel XF (registered trademark, manufactured by Du Pont-Mitsui Fluorochemicals Co., Ltd.), which is fluorocarbon, is used as a developer for the resist made up of partially fluorine bicyclic comonomer (for example, see patent document 3).

RELATED ART DOCUMENTS

Patent Documents

[Patent Document 1] Japanese Unexamined Patent Application Publication No. 2009-226762.
[Patent Document 2] Japanese Unexamined Patent Application Publication No. 2000-039717.
[Patent Document 3] Japanese Translation of PCT International Application Publication No. JP-T-2002-525683.

Non-Patent Document

[Non-Patent Document 1] XiaoMin Yang et. al. J. Vac. Sci. Technol. B25(6), November/December 2007 p. 2202

DISCLOSURE OF THE INVENTION

Problems to be Solved by the Invention

However, when a development process for the resist made up of the copolymer of α-methylstyrene and α-chloro-acrylic acid is carried out using the developer made up of n-amyl acetate in order to form a fine line-and-space pattern in which a width ratio of a portion drawn by the electron beam (hereinafter referred to as resist dissolution portion) to a portion not drawn by the electron beam (hereinafter referred to as resist non-dissolution portion) is set to the ratio of 1 to 2, on the resist layer, the resolution of about 26 nm was a limit in terms of practical use as a line width of the resist dissolution portion on the resist layer (hereinafter referred to as resolution). In addition, an electron beam dose amount required to form the width of the resist dissolution portion (hereinafter referred to as required dose amount) was approximately 120 $\mu C/cm^2$ (acceleration voltage, 100 kV).

Also, when the mixed liquid of methyl isobutyl ketone and isopropanol in patent document 2, where a ratio of methyl isobutyl ketone to isopropanol is 56 to 44 (volume mixing ratio), was used for the developer, the resolution was 20 nm, while the required dose amount for forming the width of the resist dissolution portion was approximately 350 $\mu C/cm^2$ (acceleration voltage, 100 kV).

That is, regarding the aforementioned two types of developer, the resist pattern was formed with a relatively small dose amount, but the resolution was limited up to 20 nm.

In contrast, a magnetic recording density required for practical application of a discrete track recording medium, which is one of the patterned media, is generally 1 Terabit/$inch^2$, and a track pitch to be required is approximately 50 nm. That is, the resolution of the line-and-space pattern having the width ratio of 1 to 2 is approximately 17 nm.

Next, when the isopropanol of non-patent document 1 is used for the developer, the resolution has been improved up to 14 nm. On the other hand, the required dose amount to form the width of the resist dissolution portion was approximately 1150 $\mu C/cm^2$ (acceleration voltage, 100 kV).

Also, as an example based on knowledge that the inventors have acquired and as a reference example based on a technology that is not disclosed yet, the following data are provided. That is, when only Vertrel XF is used as the developer for the resist made up of the copolymer of α-methylstyrene and α-chloro-acrylic acid, the resolution has been improved up to 11 nm. However, the required dose amount to form the width of the resist dissolution portion was approximately 800 μC/cm$^2$ (acceleration voltage, 100 kV).

In this case, the desired resolution (17 nm) is achieved, but when the aforementioned isopropanol or Vertrel XF is used as the developer, the required dose amount to form the resist dissolution portion is substantially increased, ranging from 9.6 times (approximately 1150 μC/cm$^2$) to 15 times (approximately 1800 μC/cm$^2$), compared with the case where n-amyl acetate is used as the developer (120 μC/cm$^2$, acceleration voltage, 100 kV) irrespective of the resolution. As a result, it takes a considerable amount of time for the processing of the electron beam drawing, which result in reducing the efficiency in manufacturing the master mold.

The structure which is formed by the resist dissolution portion and the resist non-dissolution portion on the resist layer is referred to as a resist pattern.

The present invention has been developed in view of the above circumstances, and it is an object of the present invention to provide a resist developer, a method for forming a resist pattern and a method for manufacturing a mold, which can yield a desired high resolution for a resist layer having a prescribed composition, while suppressing a required dose amount in forming the resist pattern.

Means for Solving the Problems

A first mode of the present invention is a developer which is used for development of a resist layer including a polymer of α-chloromethacrylate and α-methylstyrene after the resist layer is irradiated with an energy beam for drawing a pattern and exposed, wherein the developer contains a solvent A configured to include fluorocarbon and an alcohol solvent B configured to have higher dissolution speed for the resist layer than that of the solvent A.

A second mode of the present invention is a method for forming a resist pattern, the method comprising: forming a resist layer including a polymer of α-chloromethacrylate and α-methylstyrene on a substrate; performing drawing or exposure of a desired pattern by irradiating the resist layer with an energy beam; and developing the resist layer which is drawn or exposed with a developer that includes a solvent A configured to include fluorocarbon and an alcohol solvent B configured to have higher dissolution speed for the resist layer than that of the solvent A.

A third mode of the present invention according to the invention described in the second mode is characterized in that the solvent A includes CF$_3$ group on one end or both ends thereof and (CFX) group (X is F or H) on other portion between the both ends.

A fourth mode of the present invention according to the invention described in the second mode or the third mode is characterized in that the solvent A is CF$_3$—(CFX)$_n$—CF$_3$ (X is F or H, and n is a natural number).

A fifth mode of the present invention according to the invention described in any one of the second to fourth modes is characterized in that the solvent B is isopropanol.

A sixth mode of the present invention according to the invention described in any one of the second to fifth modes is characterized in that the developer comprises the solvent A and the solvent B, and a volume mixing ratio of the solvent B to (solvent A+solvent B) is higher than 25% and less than 50%.

A seventh mode of the present invention according to the invention described in any one of the second to sixth modes is characterized in that performing the drawing or exposure is a step to perform electron beam drawing, and the resist layer is made up of a resist having a sensitivity to an electron beam.

An eighth mode of the present invention is a method for forming a resist pattern, the method comprising; forming a resist layer including a polymer of α-chloromethacrylate and α-methylstyrene on a substrate and having a sensitivity to an electron beam; performing electron beam drawing on the resist layer; and developing the resist layer drawn by an electron beam with a developer that includes a solvent A made up of CF$_3$—(CFX)$_n$—CF$_3$ (X is F or H, and n is a natural number) and a solvent B made up of isopropanol, in which a volume mixing ratio of the solvent B to (solvent A+solvent B) is higher than 25% and less than 50%.

With respect to the present invention described in any one of the second to eighth modes, a ninth mode of the present invention may be A ninth mode of the present invention according to the invention described in any one of the second to eighth modes is characterized in that rinsing the resist layer with the solvent A is provided after the developing.

A tenth mode of the present invention is a method for manufacturing a mold, the method comprising: forming a resist layer including a polymer of α-chloromethacrylate and α-methylstyrene on a substrate; performing drawing or exposure of a desired pattern by irradiating the resist layer with an energy beam; and developing the resist layer which is exposed with a developer that includes a solvent A configured to include fluorocarbon and a solvent B configured to have higher dissolution speed for the resist layer than that of the solvent A.

Effects of the Invention

According to the present invention, a high resolution can be obtained for a resist layer having a prescribed composition, while suppressing a necessary irradiation amount of energy (a required exposure dose amount), for forming a resist dissolution portion with a developer, that is, for forming a resist pattern, after drawing or exposure.

MODES FOR CARRYING OUT THE INVENTION

Figure 1:
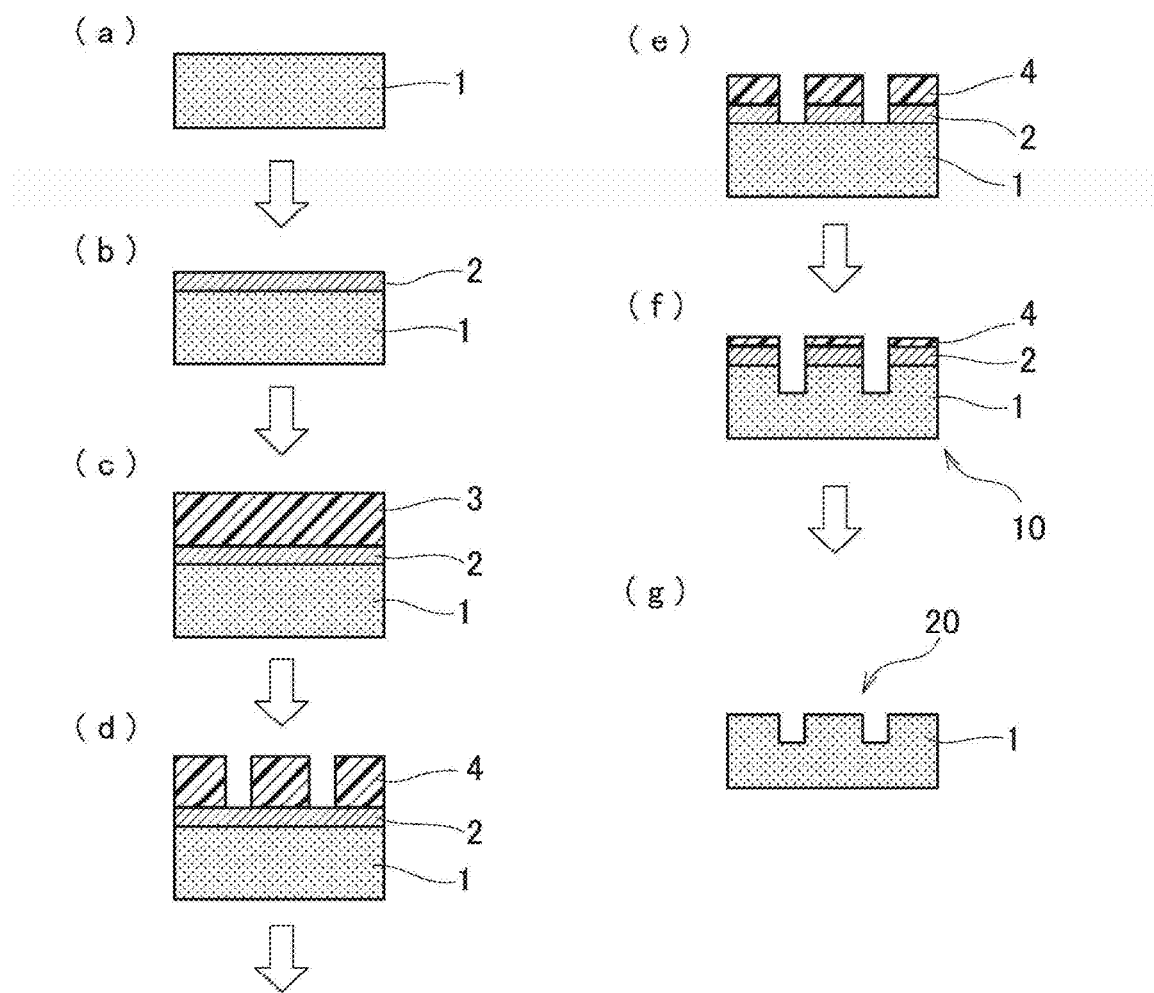
FIG. 1(a) to FIG. 1(g) are schematic cross-sectional diagrams describing manufacturing processes of a mold according to the present invention.

The inventors have examined various methods that bring a high resolution with respect to a resist layer (in the present embodiment, a resist layer including a polymer of α-chloromethacrylate and α-methylstyrene) including a prescribed composition.

In particular, the inventors have adopted a mixed liquid of Vertrel XF and isopropanol as a developer and varied its volume mixing ratio in order to reduce a required exposure dose amount, while maintaining a high resolution. As a result, it has been found that when the volume mixing ratio of isopropanol to the total volume of Vertrel XF and isopropanol is set higher than 25% and less than 50%, a resist pattern having a desired high resolution is obtained, while suppressing the required exposure dose amount.

Embodiment

Hereinafter, an embodiment of the present invention will be described by referring to FIG. 1, which shows schematic cross-sectional diagrams describing the manufacturing process of a master mold.

(Preparation of Substrate)

First, a substrate 1, which is finally made up as a master mold 20, is prepared (FIG. 1(a)).

The substrate in the present embodiment is made up of quartz, sapphire, metal such as Si, plastic, and ceramics, or the combination of these. As long as the substrate can be used as the master mold 20, the material or the structure is not limited.

In the present embodiment, the substrate 1 made up of wafer-shaped quartz will be described. Hereinafter, the substrate 1 made up of wafer-shaped quartz is merely referred to as the substrate 1. Herein, the substrate 1 may be formed in another shape besides the wafer shape, and may be a substrate formed in a rectangular, polygonal, or semicircular shape as viewed from the plane surface (top surface), or a rectangular or trapezoidal shape as viewed from the side surface, as long as the shape of the substrate is readily stabilized and secured on an imprint apparatus with high precision as a mold. Also, the substrate 1 may include a platform (mesa structure, or pedestal) on the main surface of the substrate 1, whose peripheral edge portion is slightly low relative to a pattern forming region of the main surface of the mold.

(Formation of Hard Mask Layer on Substrate)

First, the substrate 1 (FIG. 1(a)) that is polished and washed as appropriate is introduced into a sputtering apparatus. In the present embodiment, sputtering is carried out by argon gas and nitrogen gas for a target made up of chromium (Cr) so as to form a hard mask layer 2 made up of chromium nitride (FIG. 1(b)).

It is noted that the hard mask layer 2 of the present embodiment indicates a layer which is made up of a single layer or a plurality of layers, serves as a mask member when the substrate 1 is etched to form the groove portion after a portion of the hard mask layer 2, which corresponds to a groove of a resist pattern 4 (hereinafter referred to as groove portion) described later, is removed by etching, and is capable of protecting portions except for the groove portion. Incidentally, it is preferable that the hard mask layer 2 have excellent adhesion to a resist layer 3 including a polymer of α-chloromethacrylate and α-methylstyrene. In addition, it is preferable that the hard mask layer 2 have excellent etching selectivity with the resist layer 3 including the polymer of α-chloromethacrylate and α-methylstyrene. In this case, it is preferable that a film thickness of the hard mask layer 2 be thick enough to remain until the etching to form the groove in the substrate 1 is completed.

(Formation of Resist Layer)

In the present embodiment, after the substrate 1 on which the hard mask layer 2 is formed is washed as appropriate, and a dehydration bake process or a formation of an adhesion promoting layer is carried out before coating a resist in order to improve adhesion as needed, as shown in FIG. 1(c), the resist including the polymer of α-chloromethacrylate and α-methylstyrene is coated on the substrate 1 on which the hard mask layer 2 is formed, to form a resist layer 3. As a method of the resist coating, in the present embodiment, a spin-coat method is used in which, after a solution of the resist is dropped onto the main surface of the substrate 1 on which the hard mask layer 2 is formed, the substrate 1 is rotated at a prescribed rotating speed to form the resist layer 3. Next, a bake process at a prescribed temperature and for a prescribed time with a hot plate is carried out for the substrate 1 on which the resist layer 3 is spin-coated, and subsequently, the substrate 1 is moved on a cooling plate that is kept, for example, at a room temperature (22.5° C.), and a cooling process is carried out to dry and form the resist layer 3.

When the groove can be formed by etching the substrate 1 using a resist pattern 4 as a masking member without using the hard mask layer 2, the resist layer 3 may directly be formed on the substrate 1. In this case, the resist layer 3 may be provided on the substrate 1 after the dehydration bake process or the formation of the adhesion promoting layer is carried out for the substrate 1.

Any kind of resist may be used, as long as the resist is reactive with the drawing or exposure carried out by energy beam irradiation. Specifically, the resist may be such that the development process is required using a developer, and the resist may have a sensitivity to ultraviolet rays, X-rays, electron beams, ion beams, proton beams, and the like. In the present embodiment, the case will be described where the electron beam drawing is carried out. In this case, a conducting agent may be applied on the resist layer 3 in order to prevent a charge build-up.

Also, in this case, it is preferable that a thickness of the resist layer 3 be a thickness to the extent that the resist layer remains until the etching of the hard mask layer 2 formed in the substrate 1 is complete. This is because not only portions corresponding to the resist dissolution portion formed on the resist layer 3 but also the resist layer 3 of the resist non-dissolution portion is substantially removed through the etching of the hard mask layer 2.

(Pattern Drawing)

Next, a desired pattern is drawn on the resist layer 3 with an electron beam lithography apparatus.

The fine pattern may be of micrometer-size, and in view of performance of electric devices in recent years, the pattern may be of nanometer-size, and preferably be of nanometer-size in terms of the performance of end products.

In the present embodiment, a case where the resist layer 3 is a positive-type resist, and a portion drawn by the electron beam serves as the resist dissolution portion that corresponds to the groove portion of the mold 20, will be described.

(Development)

After a desired fine pattern is drawn by the electron beam, as shown in FIG. 1(d), the resist layer 3 is developed by a prescribed developer and the portion drawn by the electron beam (resist dissolution portion) on the resist layer 3 is removed, to form a resist pattern 4 corresponding to the desired fine pattern.

Incidentally, in the present embodiment, the drawn resist layer 3 is developed, that is, the resist layer of the resist dissolution portion is dissolved and removed by the developer that includes two types of solvents made up of a solvent A including fluorocarbon and an alcohol solvent B having higher solubility to the resist than that of the solvent A.

In the present embodiment, a case will be described where $CF_3$—CFH—CFH—$CF_2$—$CF_3$ (Vertrel XF (registered trademark, manufactured by Du Pont-Mitsui Fluorochemicals Co., Ltd.), hereinafter also referred to as compound Y) serves as the solvent A, and isopropanol serves as the solvent B, and a mixed solution of the solvent A and the solvent B is used for the developer.

Then, the composition of the developer is such that a volume mixing ratio of isopropanol (solvent B) to (solvent A+solvent B) is higher than 25% and less than 50%, and in particular, preferable in the vicinity of 37.5%.

Figure 2:
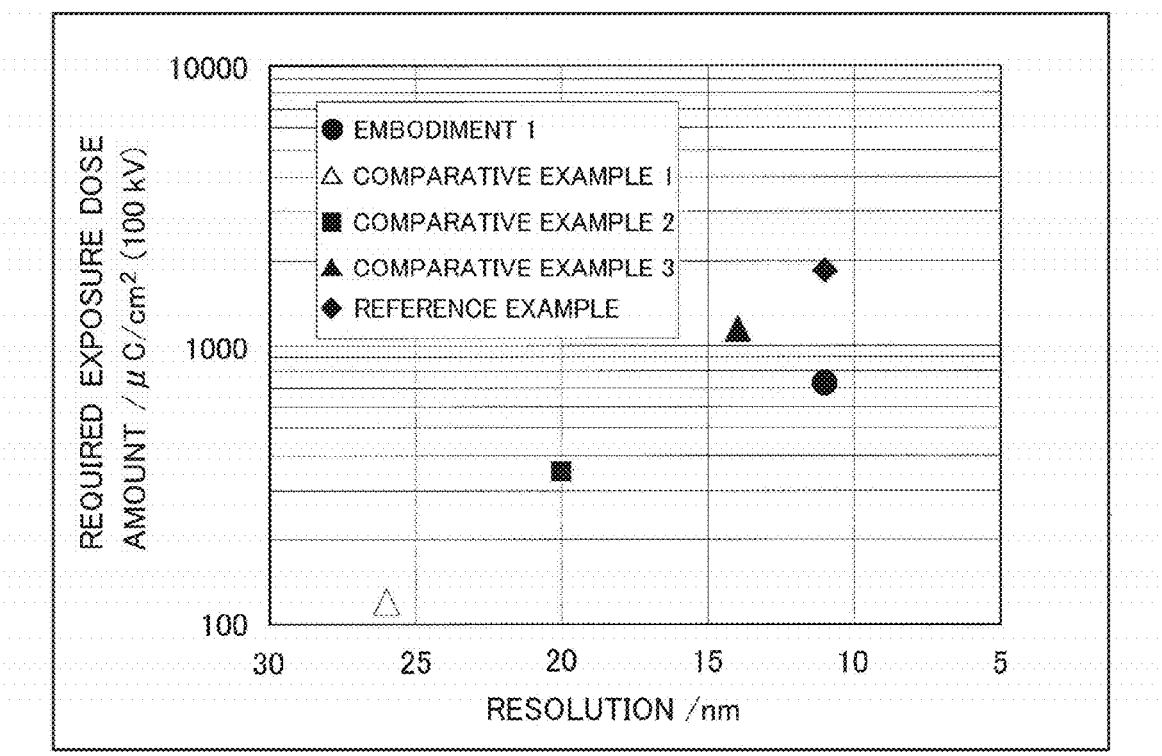
FIG. 2 is a graph illustrating a relationship between a resolution and an exposure dose amount required for dissolving a resist, that is, for forming a resist pattern in an electron beam drawing portion, in the embodiments and comparative examples.
Figure 4:
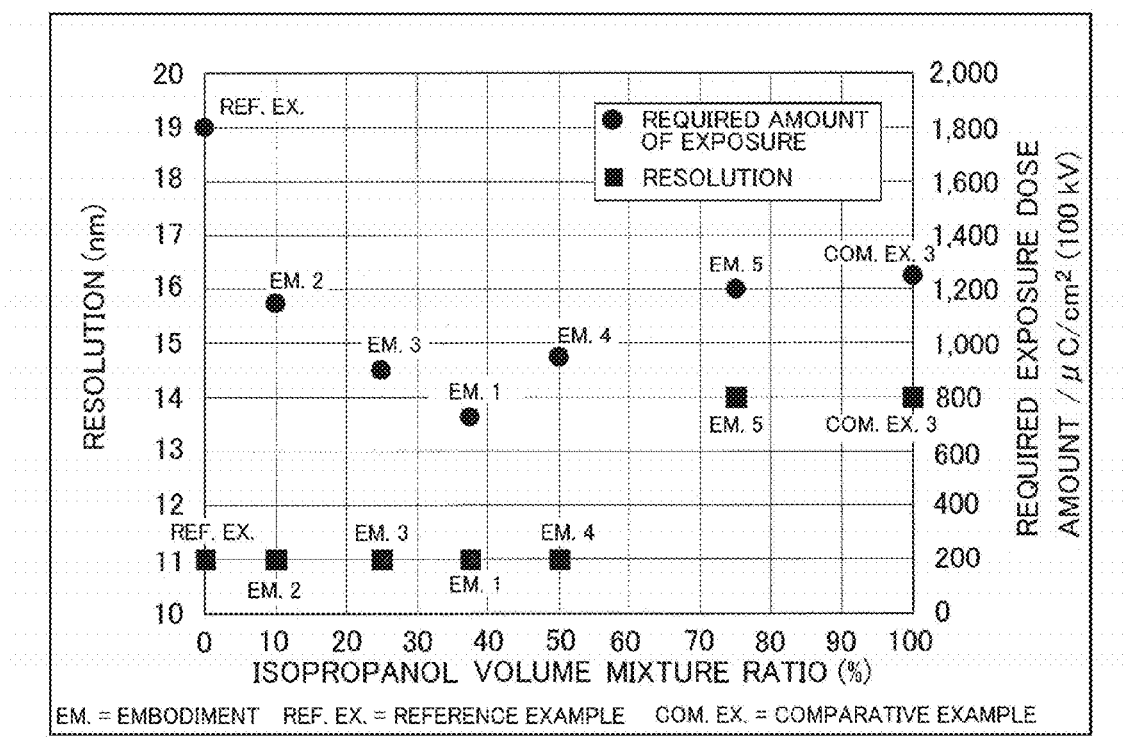
FIG. 4 is a graph illustrating a volume mixing ratio of a solvent A and a solvent B that minimizes a required exposure dose amount to form a resist pattern, in embodiments 1 to 5, with respect to a sample in which the volume mixing ratio of the solvent B to (solvent A+solvent B) is 10%, 25%, 37.5%, 50%, and 75%, and further illustrating similarly the volume mixing ratios in a reference example and comparative examples 1 to 3.

As shown in FIG. 2 and FIG. 4 (described later in the embodiment) that describe a relationship between a resolution and an exposure dose amount required for the resist dissolution, the following noticeable advantage can be obtained by using the aforementioned solvent A and solvent B and preferably, the volume mixing ratio set to the aforementioned value. Namely, the required exposure dose amount can substantially be reduced, compared with the case where only the compound Y or only isopropanol is used for the developer, while maintaining a high degree of resolution obtained in the case where only the compound Y is used for the developer. When the required exposure dose amount is reduced, the drawing time of the electron beam can be shortened, and the productivity of electron beam drawing can greatly be improved. Further, an output of the electron beam (current value) can be reduced, and finer patterns can also be drawn.

The reason why the required exposure dose amount is reduced, compared with the case where the resolution is maintained and the compound Y or isopropanol is individually used for the developer, has diligently been examined. It is assumed that the compatibility of surface tension and viscosity of the compound Y with isopropanol is affected.

As a concrete method of the development process for the resist layer 3, the following method is exemplified.

That is, the substrate 1 on which the hard mask layer 2 and the resist layer 3 are provided and desired patterns are drawn by the electron beam is rotated at a prescribed rotating speed. Then, the developer made up of the mixed liquid of the solvent A and the solvent B is dropped to supply from above the substrate 1. In this case, the developer may be kept at a room temperature or maintained at a prescribed temperature. During the dropping of the developer, the dissolution of the resist dissolution portion by the developer occurs.

Also, after the dissolution of the resist dissolution portion is completed, the developing liquid continues to be dropped excessively while the substrate 1 is rotated, whereby the centrifugal force of the rotation of the substrate 1 allows the developer including a resist dissolved material to flow out from the outer edge portion of the substrate. Further, when the developing liquid continues to be dropped excessively while the substrate 1 is rotated, the developer including the resist dissolved material is replaced with a developer that does not include the resist dissolved material, and a clean resist pattern is formed.

It is noted that the solvent A may be made up of any of fluorocarbon, perfluorocarbon, or fluoroether, or the mixed liquid of these. With use of the solvent A, the following effects can be expected. The solvent A made up of any of fluorocarbon, perfluorocarbon, or fluoroether, or the mixed liquid of these is a poor solvent whose dissolution speed of the resist layer including the polymer of α-chloromethacrylate and α-methylstyrene is extremely low. By making the solvent poor, the dissolution speed of the resist layer 3 can be reduced. Thus, the unnecessary dissolution of the resist non-dissolution portion by an excessively high dissolution speed can be prevented, and accordingly, the resolution can be improved. Also, the solvent A made up of any of fluorocarbon, perfluorocarbon, or fluoroether, or the mixed liquid of these is relatively low in surface tension and viscosity. Consequently, the solvent A readily penetrates into infinitesimal gaps, so that the solvent A burrows through the resist layer while dissolving the resist layer, even if the electron beam drawing portion (resist dissolution portion) is infinitesimal, whereby forming infinitesimal resist patterns of nanometer-size.

Also, in view of reducing the surface tension, it is preferable that the solvent A exemplified herein be made up of $CF_3$—$(CX)_n$—$CF_3$ (X is mixture of F and H, and n is a natural number, that is, fluorocarbon, hereinafter referred to as compound A), $CF_3$—$(CX)_n$—$CF_3$ (X is F, and n is the natural number, that is, perfluorocarbon, hereinafter referred to as compound B), or $CF_3$—$(CX)_m$—O—$(CX)_n$—$CX_3$ (X is F or H, or mixture of F and H, and m and n are an integer, that is, fluoroether, hereinafter referred to as compound C), or the compounds A and B, or the compounds A and C, or the compounds B and C, or the mixture of the compounds of A, B, and C.

Also, the other solvent B is not limited to the isopropanol, but a solvent may also be used as long as the dissolution speed of the resist layer 3 by the solvent is higher than that of the solvent A, and when the solvent is used for developer as a mixed solution with the solvent A, the required exposure dose amount to form the resist pattern 4 (to dissolve the resist dissolution portion) is small, compared with the case where the solvent B is individually used for the developer.

In the present embodiment, the only two types of solvents, which are the solvent A and the solvent B, are used. However, other solvents may be mixed besides these solvents. For example, a compound that serves as a poorer solvent with respect to the resist layer 3 than the solvent B and has a high affinity with the solvent A may be mixed. In this case, similarly to the above, the compound may be used as long as the required exposure dose amount to form the resist pattern 4 (to dissolve the resist dissolution portion) is small, compared with the case where the solvent B is individually used for the developer, when the compound is mixed with the solvent A to form a mixed solution as the developer.

(Rinsing)

Subsequently, immediately after the supply of the developer is stopped, a rinsing agent is dropped from above the substrate 1 to wash the developer away, while rotating the substrate 1.

It is preferable that the dropping of the rinsing agent is carried out before stopping the dropping of the developer. Thus, the developer is instantly replaced with the rinsing agent, so that it can be prevented that the resist dissolved materials remaining in the developer that stays on the substrate is precipitated again as a contamination.

Further, it is preferable that the rinsing agent be made of the same material as that of the solvent A of the developer. The solvent A whose surface tension is low is used for the rinsing agent, so that pattern collapse can be prevented or reduced in a subsequent drying process.

(Drying)

A drying process is carried out for the substrate 1 for which the rinsing process is applied. The drying process is carried out by rotating the substrate 1 at a prescribed rotation speed after the dropping of the rinsing agent is stopped after the rinsing process is carried out. Accordingly, the centrifugal force allows the rinsing agent to flow out from the outer edge portion of the substrate, or to evaporate. Thus, the substrate 1 with the hard mask layer 2 on which the resist pattern 4 made up of the desired resist dissolution portion and the resist non-dissolution portion is formed, can be obtained.

It is noted that a bake process may be carried out after the drying process as needed for the purpose of removing the developer or the rinsing agent remaining in the patterned resist pattern 4 and improving the adhesion between the resist pattern 4 and the hard mask layer 2.

(Descum of Resist Pattern: First Etching)

Subsequently, the substrate 1 with the hard mask layer 2 on which the resist pattern 4 is formed is introduced into a dry etching apparatus. Then, the first etching is carried out using a mixed gas of oxygen gas and argon (Ar) gas so as to remove a residue (scum) of the resist dissolution portion. Incidentally, a fluorine gas, for example, $CF_4$ may be used in place of the oxygen gas. Also, helium (He) may be added.

(Etching of Hard Mask Layer: Second Etching)

Subsequently, after exhausting the gas used in the first etching, second etching is carried out using a mixed gas made up of chlorine gas and oxygen gas so as to remove the hard mask layer 2 which was exposed through the development process and the first etching process.

As shown in FIG. 1(*e*), the grooving corresponding to the resist pattern 4 is performed for the hard mask layer 2 on the substrate 1.

It is noted that the end point in etching in this case is determined using, for example, a reflective optical end point detector, and a plasma monitor.

(Etching of Substrate: Third Etching)

Subsequently, after exhausting the gas used in the second etching, third etching is carried out for the substrate 1 using fluorine-based gas.

Thus, as shown in FIG. 1(*f*), the grooving corresponding to the resist pattern 4 is performed for the substrate 1, and a mold 10 in which a remaining resist of resist pattern 4 on the hard mask layer 2 is not removed except for the groove portion is manufactured.

It is noted that the fluorine-based gas to be used is exemplified by $C_xF_y$ (for example, $CF_4$, $C_2F_6$, $C_3F_8$), $CHF_3$ or the mixed gas of these, or the gas including these and a noble gas (He, Ar, Xe, and the like) as an additive gas. Regarding the etching of the substrate 1, when the substrate 1 is made up of quartz or Si wafer, and patterns to be formed are of micrometer-size, wet etching using hydrofluoric acid may be carried out.

(Removal of Resist Pattern)

Subsequently, the residual of the resist pattern 4 that is generated after the third etching is removed by a resist release agent made up of the mixed solution of sulfuric acid and hydrogen peroxide solution so as to completely remove the resist pattern 4.

Specifically, the substrate 1 is soaked into the resist release agent in a prescribed time, and subsequently, the resist release agent is washed out by the rinsing agent (herein, pure water having a normal or heated temperature). Then, the substrate 1 is dried in the same method as that of the drying process.

It is noted that the resist release agent to be used includes an organic solvent (in the case of the resist including the polymer of α-chloromethacrylate and α-methylstyrene, anisole, or N,N-dimethylacetamide (ZDMAC, manufactured by Zeon Corporation), ozone water, and the like, in addition to the mixed solution of sulfuric acid and hydrogen peroxide solution. A compound may be used as a resist release agent as long as the compound is capable of swelling and dissolving the resist or chemically dissolving the resist to remove the resist. Also, these resist release agents may be heated in order to enhance the capability of removing the resist. Furthermore, an ashing process using an oxygen plasma may be applied.

In addition, the removal of the resist pattern 4 may be carried out after the second etching process and prior to the third etching process.

(Removal of Hard Mask Layer: Fourth Etching)

Subsequently, using the same method as the first etching, a process of removing the hard mask layer 2 is carried out through the dry etching, in which the hard mask layer 2 is formed corresponding to the resist pattern 4 that remains on the mold 10 prior to removing the remaining hard mask layer 2. When there is a chemical solution capable of dissolving and removing the hard mask layer, wet etching may be applied to the removal of the hard mask layer.

After the aforementioned processes are completed, washing of the substrate 1 is carried out, if needed. Thus, the master mold 20 as shown in FIG. 1(*g*) is completed.

Meanwhile, the etching may be performed in such a manner that wet etching is applied to one etching process while dry etching is applied to the other etching processes, or wet etching or dry etching is applied to all etching processes. The etching may be performed in accordance with a pattern size in such a manner that, for example, wet etching is applied to the etching when the pattern size is of micrometer-size, while the dry etching is applied to the etching when the pattern size is of nanometer-size.

In the above-described embodiments, the following effects can be obtained.

That is, by using the developer that includes the solvent A containing fluorocarbon and the alcohol solvent B, a resist pattern can be formed with a desired high resolution, while suppressing the required exposure dose amount in dissolving the resist.

In the present embodiment, the description is focused on the resist containing the polymer of α-chloromethacrylate and α-methylstyrene. However, it is considered that technical concept of the present invention is not limited to this type of resist. That is, it is considered that the solvent A and the solvent B constituting the developer for the resist can appropriately be prepared in accordance with the type of the resist. Also, when other type of compound is used for the solvent A instead of using fluorocarbon described in the present embodiment, and a compound having a higher degree of resist dissolution than that of the solvent A is used for the alcohol solvent B, there is a possibility that the effects described in the present embodiment are also provided. Further, regarding rinsing liquid, it is considered that other type of compound can be used for the rinsing liquid, instead of using fluorocarbon described in the present embodiment.

The technical concept of the prevent invention described above is diligently studied now by the inventors.

Also, the developer, the method of forming the resist pattern, and the method of manufacturing the mold in the embodiment 1 can suitably be applied to the following various purposes other than the mold manufacturing, for example, can widely be applied to manufacturing a photo mask for semiconductor apparatuses, semiconductor manufacturing, micro electro mechanical systems (MEMS), sensor elements, optical discs, optical components such as a diffraction grating and a polarizing element, nano devices, organic transistors, color filters, micro lens arrays, immunoassay chips, DNA separation chips, microreactors, nano-bio devices, optical waveguides, optical filters, and photonic crystal.

The embodiment according to the present invention has been described above, the aforementioned disclosure indicates an exemplary embodiment of the present invention, but the scope of the prevent invention is not limited to the aforementioned exemplary embodiment. Irrespective of whether explicit description or suggestion is found in the specification, a person skilled in the art can implement the invention by adding various changes to the embodiment of the present invention based on the disclosure of the specification.

Embodiment

Next, the present invention will specifically be described by showing embodiments. It is matter of course the prevent invention is not limited to the embodiments below.

Embodiment 1

In the present embodiment, a wafer-shaped synthesized quartz substrate (150 mm in outer diameter and 0.7 mm in thickness) was used (FIG. 1(a)) as a substrate 1.

First, the substrate 1 is introduced into the sputtering apparatus, and a target made of chromium (Cr) is sputtered by argon gas and nitrogen gas to form the hard mask layer 2 made up of chromium nitride having a thickness of 2 nm (FIG. 1(b)). Baking was carried out for the substrate 1 on which the hard mask layer is formed, on a hot plate at 200° C. for 10 minutes in order to perform a dehydration bake process. Subsequently, the substrate 1 was placed on a cooling plate that is kept at a room temperature (22.5° C.), to cool the substrate 1.

Next, the substrate 1 on which the hard mask layer is formed was placed on a resist coater. Then, ZEP520A-7 (manufactured by Zeon Corporation), which is the polymer of α-chloromethacrylate and α-methylstyrene, was diluted with ZEP-A (manufactured by Zeon Corporation), which is the solvent for ZEP520A-7 and anisole, in such a manner that a volume mixing ratio of ZEP520A-7 to ZEP-A is 1 to 3, to prepare the resist solution in advance. Thus, the resist solution of approximately 3 ml was dropped on the substrate 1, and subsequently, the substrate 1 was rotated at 4000 rpm for 45 seconds.

After spin coating of the resist solution, the baking (post bake) was carried out for the substrate 1 on the hot plate at 200° C. for 15 minutes to remove the unnecessary residual solvent in the resist layer, and the resist layer made up of ZEP520A having a thickness of 30 nm was obtained.

Then, a line-and-space pattern in which a width ratio of an electron beam drawing portion (resist dissolution portion) to an electron beam non-drawing portion (resist non-dissolution portion) is 1 to 2 was drawn using a point-beam-type electron beam lithography apparatus that has an acceleration voltage of 100 kV. In this case, the electron beam drawing was performed in such a manner that a width of a portion corresponding to the resist dissolution portion was increased in increments of 3 nm between 8 nm and 30 nm.

Subsequently, the resist layer of the substrate 1 was developed using the developer according to the present embodiment. In the developer according to the present embodiment, $CF_3$—$CFH$—$CFH$—$CF_2$—$CF_3$ (Vertrel XF: registered trademark, manufactured by Du Pont-Mitsui Fluorochemicals Co., Ltd.) was used for the solvent A, and isopropanol was used for the solvent B. In this time, the volume mixing ratio of the solvent A to the solvent B was 5 to 3, that is, the volume mixing ratio of isopropanol to the total volume of Vertrel XF and isopropanol was 37.5%.

In the course of the development process, the substrate 1 was continuously rotated at 250 rpm. Then, the developer was dropped for 30 seconds from above the substrate 1. In this case, the developer was kept at the room temperature (22.5° C.).

The substrate 1 was continuously rotated, and a process for replacing the developer after the development process with the rinsing liquid was carried out. That is, the rinsing agent (Vertrel XF) was dropped from above the substrate 1. The rinsing liquid was kept at the room temperature (22.5° C.). The dropping of the rinsing liquid was started 10 seconds before the developer was stopped to drop. Subsequently, the rinsing agent was continued to supply for 30 seconds after the dropping of the developer was stopped, while continuously rotating the substrate 1, and after that the dropping of the rinsing agent was stopped. Then, the drying process was carried out by rotating the substrate 1 at appropriately 1500 rpm. Thus, a sample according to the embodiment was prepared.

In this time, a line width of the resist dissolution portion that has a regular resolution was measured, in order to determine a limiting resolution of the line width for practical use. The regular resolution means that there is no substantial residual in the resist dissolution portion, there is no connection between the adjacent resist non-dissolution portions, and further, there is no curvature or meandering in the patterns that is considerably departed from a prescribed drawing pattern, as well as a width ratio of the electron beam drawing portion (resist dissolution portion) to the electron beam non-drawing portion (resist non-dissolution portion) is approximately 1 to 2. In addition, an exposure dose amount with which the limiting resolution for practical use was obtained was specified as the required exposure dose amount.

Embodiments 2 to 5

In the embodiment 1, the volume mixing ratio of the solvent A to the solvent B was 5 to 3, that is, the volume mixing ratio of the solvent B to (solvent A+solvent B) was 37.5%. In contrast, in the embodiments 2 to 5, the volume mixing ratio of the solvent B to (solvent A+solvent B) was varied to 10%, 25%, 50%, and 75%. As with the embodiment 1 except for the ratio, a sample was similarly manufactured. As a reference example, a sample having the ratio of 0% was also manufactured. A sample having the ratio of 100% corresponds to a comparative example 3 described later.

Reference Example

The following sample that shows remarkable effects of the embodiment and not disclosed yet was manufactured as a reference example based on the knowledge obtained by the inventors so far. That is, the reference example was prepared as with the embodiment 1 except that the developer was made up of only Vertrel XF instead of the mixed solution of Vertrel XF and isopropanol in the embodiment.

Comparative Examples 1 to 3

Instead of the developer made up of Vertrel XF and isopropanol in the embodiment, in the comparative example 1, the developer was made of only ZED-N50 (manufactured by Zeon Corporation) made up of n-amyl acetate. In the comparative example 2, the developer was made of ZMD-C (manufactured by Zeon Corporation) made up of a mixed solution of methyl isobutyl ketone and isopropanol (volume mixing ratio is 56 to 44). In the comparative example 3, the sample was similarly prepared as with the embodiment 1 except that only isopropanol was used for the developer.

<Evaluation>

Figure 3:
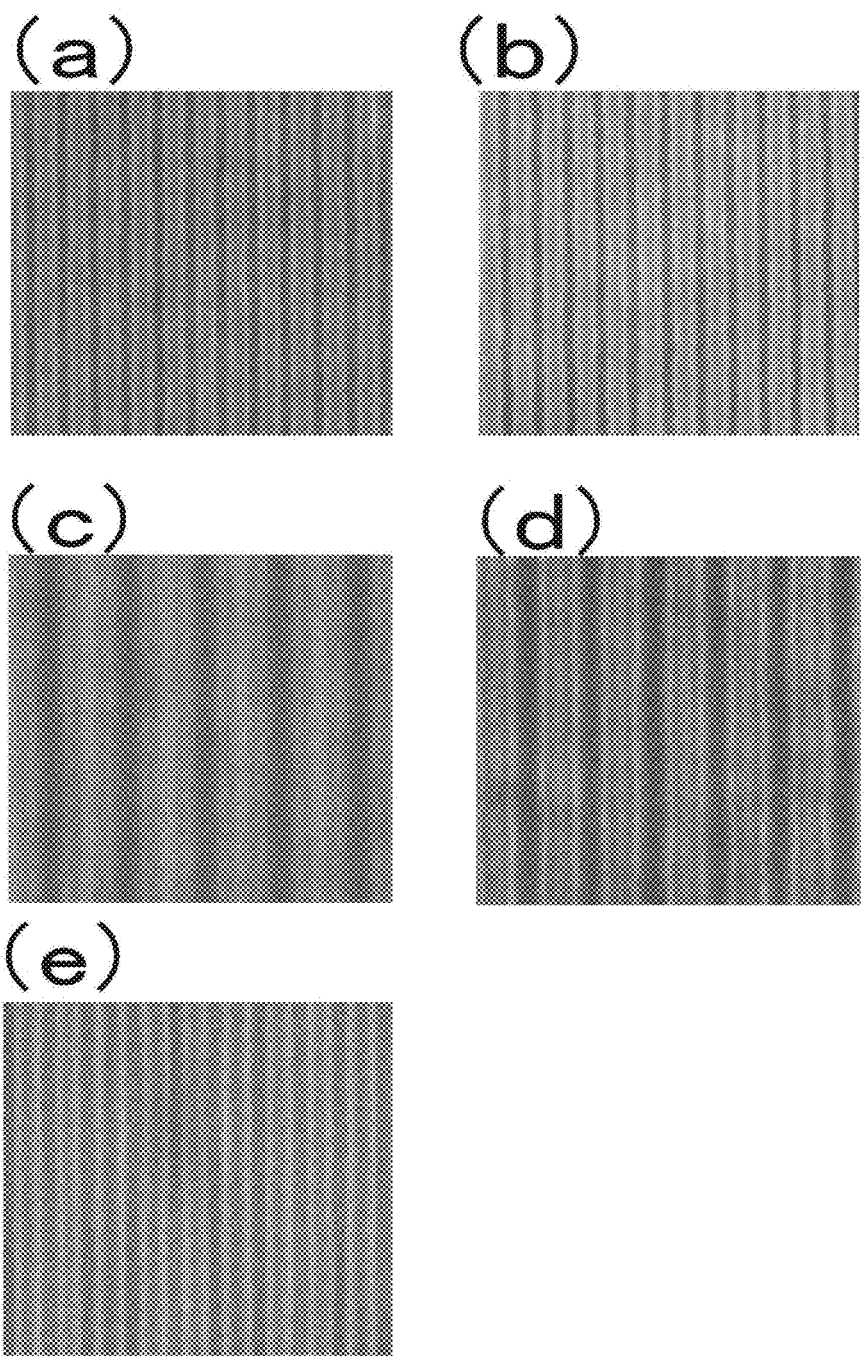
FIG. 3(a) to FIG. 3(e) are photographs showing results of observation of a resist pattern in the process of manufacturing a sample (mold) in the embodiments and comparative examples with a scanning electron microscope.

Evaluations for the samples (quartz substrate with a resist pattern; a chromium nitride film is formed directly on the quartz substrate as a hard mask layer, and the resist pattern made of ZEP520A, which is a polymer of α-chloromethacrylate and α-methylstyrene, is formed on the chromium nitride film) that were obtained from the embodiment, the reference example, and the comparative examples, have been made. The results are shown in FIG. 2 to FIG. 4.

FIG. 2 is a graph illustrating a relationship between a limiting resolution for practical use and a required exposure dose amount for resist dissolution in the embodiment 1, the reference example, and the comparative examples 1 to 3.

FIG. 3(a) to FIG. 3(e) are photographs of a resist pattern in the course of manufacturing of samples (molds) in the embodiment 1, the reference example, and the comparative examples 1 to 3, which were observed from above the front surface thereof with a scanning electron microscope.

FIG. 4 is a graph illustrating the volume mixing ratio of the solvent A and the solvent B that minimizes the required exposure dose amount to form the resist pattern, with respect to the sample in which the volume mixing ratio of the solvent B to (solvent A+solvent B) is 37.5% (embodiment 1), 10%, 25%, 50%, or 75% (sequentially referred to the embodiments 2 to 5) in the embodiment 1 and the embodiments 2 to 5.

In the embodiment 1, as shown in FIG. 2 and FIG. 3(a), the resist pattern with a high resolution of 11 nm has been obtained. In particular, in the case where the volume mixing ratio of the solvent B to (solvent A+solvent B) is 37.5% (that is, in the embodiment 1), the resist pattern with a high resolution of 11 nm has been obtained with a low exposure dose amount of approximately 725 µC/cm$^2$ (approximately 63% of 1150 µC/cm$^2$), in comparison with the required exposure dose amount of approximately 1150 µC/cm$^2$ in the case where the developer is made of 100% solvent B in the comparative example 3. In addition, the resist pattern of a high resolution has been obtained, in comparison with the case of the comparative example 2.

As a result, in the embodiment 1, the resolution has been improved in comparison with the comparative examples 1 to 3, and has been comparable to that of the reference example.

From FIG. 4 which was obtained based on the evaluation results of the samples according to the embodiments 1 to 5, the reference examples, and the comparative examples 3, it was found that a more preferable result is obtained when the volume mixing ratio of isopropanol to the total volume of Vertrel XF and isopropanol is set higher than 25% and less than 50%. The most preferable result has been obtained in the vicinity of 37.5%.

When the developer in the reference example is made of 100% solvent A (Vertrel XF), the resolution of 11 nm has been obtained with the required exposure dose amount of approximately 1800 µC/cm$^2$. In contrast, in the embodiment 1, the resist pattern with a high resolution of 11 nm has been obtained with the low exposure dose amount of approximately 725 µC/cm$^2$ (approximately 40% of 1800 µC/cm$^2$) (FIG. 3(b)).

On the other hand, as shown in FIG. 2 and FIG. 3(c) to FIG. 3(e), in the comparative example 1, the resolution was 26 nm and the required exposure dose amount was 120 µC/cm$^2$, requiring a low exposure dose amount. However, the limiting resolution for practical use was low, compared with the embodiment 1 (FIG. 2: comparative example 1, FIG. 3(c)).

In the comparative example 2, the resolution was 20 nm and the required exposure dose amount was 350 µC/cm$^2$, requiring a low exposure dose amount as with the comparative example 1, but the limiting resolution for practical use was poor, compared with the embodiment 1 (FIG. 2: comparative example 2, FIG. 3(d)).

As described above, the resolution of 17 nm (line-and-space pattern having a width ratio of space to line is 1 to 2) that is required for a track pitch of approximately 50 nm in DTRM to be required to achieve a magnetic recording density of "1 Terabit/inch$^2$" cannot be obtained in the comparative example 1 and the comparative example 2.

Next, in the comparative example 3, the resolution was 14 nm and the required exposure dose amount was 1150 µC/cm$^2$. The resolution satisfies the desired resolution of 17 nm, but the resolution and the required exposure dose amount were poor, compared with the embodiment 1 (FIG. 2: comparative example 3, FIG. 3(e)).

DESCRIPTION OF THE REFERENCE NUMERAL

1 Substrate
2 Hard mask layer
3 Resist layer
4 Resist pattern
10 Remaining hard mask layer and mold before removing resist layer
20 Mold (master mold)

The invention claimed is:

1. A resist developer that is used for development of a resist layer including a polymer of α-chloromethacrylate and α-methylstyrene after drawing or exposure by irradiating the resist layer with an energy beam, the resist developer comprising:
   a solvent A configured to include fluorocarbon;
   an alcohol solvent B configured to have a solubility of the resist layer higher than the solubility of the solvent A; and wherein a volume mixing ratio of the solvent B to a sum of solvent A plus solvent B is higher than 25% and less than 50%.

2. A method for forming a resist pattern, the method comprising:
   forming a resist layer including a polymer of α-chloromethacrylate and α-methylstyrene on a substrate;
   performing drawing or exposure of a prescribed pattern by irradiating the resist layer with an energy beam; and
   developing the resist layer which is drawn or exposed with a developer that includes a solvent A configured to include fluorocarbon and an alcohol solvent B configured to have a solubility of the resist layer higher than the solubility of the solvent A.

3. The method for forming the resist pattern according to claim 2, further comprising:
   arranging a $CF_3$ group on one end or both ends of the fluorocarbon of the solvent A and a CFX group (X is F or H) between the both ends.

4. The method for forming the resist pattern according to claim 2, further comprising:
   using $CF_3$—$(CFX)_n$—$CF_3$ (X is F or H, and n is a natural number) as the solvent A.

5. The method for forming the resist pattern according to claim 2, further comprising:
   using isopropanol as the solvent B.

6. The method for forming the resist pattern according to claim 2, further comprising:
   forming the developer with the solvent A and the solvent B; and
   setting a volume mixing ratio of the solvent B to (solvent A+solvent B) higher than 25% and less than 50%.

7. The method for forming the resist pattern according to claim 2,
wherein the performing the drawing or exposure is performing electron beam drawing, and the method further comprising:
forming the resist layer made up of a resist having a sensitivity to an electron beam.

8. The method for forming the resist pattern according to claim 2, further comprising:
setting a rinsing process with the solvent A for the resist layer after the developing.

9. A method for forming a resist pattern, comprising:
forming a resist layer that includes a polymer of α-chloromethacrylate and α-methylstyrene on a substrate and has a sensitivity to an electron beam;
performing electron beam drawing on the resist layer; and
developing the resist layer which is drawn or exposed with a developer that includes a solvent A made up of $CF_3—(CFX)_n—CF_3$ (X is F or H, and n is a natural number) and a solvent B made up of isopropyl alcohol, wherein a volume mixing ratio of the solvent B to (solvent A+solvent B) is higher than 25% and less than 50%.

10. A method for manufacturing a mold, comprising:
forming a resist layer including a polymer of α-chloromethacrylate and α-methylstyrene on a substrate;
performing drawing or exposure of a prescribed pattern by irradiating the resist layer with an energy beam; and
developing the resist layer drawn or exposed with a developer that includes a solvent A configured to include fluorocarbon and an alcohol solvent B configured to have a solubility of the resist layer higher than the solubility of the solvent A.

* * * * *